(12) United States Patent
Peng

(10) Patent No.: US 8,851,930 B2
(45) Date of Patent: Oct. 7, 2014

(54) MINI DISPLAY PORT CONNECTOR

(75) Inventor: Sheng-Wen Peng, Taipei (TW)

(73) Assignee: Tyco Electronics Holdings (Bermuda) No. 7 Ltd., Pembroke HM (BM)

( * ) Notice: Subject to any disclaimer, the term of this patent is extended or adjusted under 35 U.S.C. 154(b) by 0 days.

(21) Appl. No.: 13/572,010

(22) Filed: Aug. 10, 2012

(65) Prior Publication Data

US 2013/0040501 A1    Feb. 14, 2013

(30) Foreign Application Priority Data

Aug. 12, 2011   (CN) .......................... 2011 2 0293109

(51) Int. Cl.
| | |
|---|---|
| *H01R 24/00* | (2011.01) |
| *H01R 13/6594* | (2011.01) |
| *H01R 13/6461* | (2011.01) |
| *H05K 1/11* | (2006.01) |
| *H05K 1/02* | (2006.01) |
| *H01R 12/57* | (2011.01) |

(52) U.S. Cl.
CPC ........ *H01R 13/6594* (2013.01); *H01R 13/6461* (2013.01); *H05K 2201/09709* (2013.01); *H05K 1/115* (2013.01); *H05K 1/0248* (2013.01); *H01R 12/57* (2013.01); *H05K 2201/10295* (2013.01); *H05K 2201/1031* (2013.01)
USPC ....................................................... 439/660

(58) Field of Classification Search
USPC .................. 439/660, 80, 78–79, 260, 55, 680
See application file for complete search history.

(56) References Cited

U.S. PATENT DOCUMENTS

| | | | | |
|---|---|---|---|---|
| 7,708,601 | B2 * | 5/2010 | Tanaka .......................... | 439/660 |
| 7,841,910 | B2 * | 11/2010 | Fields et al. .................. | 439/680 |
| 8,047,880 | B2 * | 11/2011 | Fields et al. .................. | 439/680 |
| 8,221,137 | B2 * | 7/2012 | Zheng et al. .................... | 439/80 |
| 8,376,783 | B2 * | 2/2013 | Kondo et al. ................. | 439/660 |
| 2007/0066115 | A1 * | 3/2007 | Saito et al. .................... | 439/260 |
| 2009/0117754 | A1 * | 5/2009 | Fields et al. .................... | 439/55 |

FOREIGN PATENT DOCUMENTS

| | | |
|---|---|---|
| TW | 364341 M | 9/2009 |
| TW | 386630 M | 8/2010 |

\* cited by examiner

*Primary Examiner* — Alexander Gilman
(74) *Attorney, Agent, or Firm* — Barley Synder

(57) ABSTRACT

An electrical connector for connection with a circuit board having a plurality of through holes and a plurality of SMT contacts. The electrical connector having a plurality of through hole terminals positioned according to the plurality of through holes and arranged in a top-down manner along an upper row and a lower row, and a plurality of SMT terminals positioned sequentially adjacent to each other along a common row in corresponding position to the plurality of SMT contacts on the circuit board.

18 Claims, 17 Drawing Sheets

MINI DISPLAY PORT CONNECTOR

CROSS-REFERENCE TO RELATED APPLICATION

This application claims priority under 35 U.S.C. §119 to Chinese Application No. 201120293109.0 of Aug. 12, 2011.

FIELD OF THE INVENTION

The present invention relates to an electrical connector, and, more particularly, to a mini displayport connector with symmetrically arranged high-speed signal terminal sets for signal skew reduction.

BACKGROUND

As a result of advancements in technology, the resolution of a display device, such as liquid crystal display (LCD) or LCD TV, has gradually been enhanced. The LCD TVs on the current market are usually provided with a High Definition Multimedia Interface (briefed as HDMI hereinafter) or a DisplayPort interface to be connected with a computer or other video devices. The DisplayPort is a new generation of digital video interface standard promoted by VESA (Video Electronics Standards Association), such that the transmission interface of a computer monitor may support the plug-and-play function, which is forecasted to replace the conventional LVDS, DVI and VGA transmission interfaces.

Furthermore, following the development of multimedia technology, the DisplayPort has been developed with a mini displayport connector. The mini displayport connector has gradually and widely been applied in electronic devices. The mini displayport is a micro version of DisplayPort, which was announced by Apple Co., Oct. 14, 2008. Apple provides free and public authorization for other manufactures to develop associated products for mini displayport. The mini displayport has 20 pins, and the pin assignment are as follows: pin 1—ground (GND); pin 2—Hot Plug Detect; pin 3—real signal of Lane 0 (ML_Lane 0 (p)); pin 4—external configuration support 1 (CONFIG1); pin 5—auxiliary signal of Lane 0 (ML_Lane 0 (n)); pin 6—external configuration support 2 (CONFIG2); pin 7—ground (GND); pin 8—ground (GND); pin 9—real signal of Lane 1 (ML_lane 1 (p)); pin 10—real signal of Lane 3 (ML_Lane 3 (p)); pin 11—auxiliary signal of Lane 1 (ML_Lane 1 (n)); pin 12—auxiliary signal of Lane 3 (ML_Lane 3 (n)); pin 13—ground (GND); pin 14—ground (GND); pin 15—real signal of Lane 2 (ML_Lane 2 (p)); pin 16—real signal of auxiliary channel (AUX_CH (p)); pin 17—auxiliary signal of Lane 2 (ML_Lane 2 (n)); pin 18—auxiliary signal of auxiliary channel (AUX_CH(n)); pin 19—ground (GND); and, pin 20—connector power (DP_PWR).

As shown in FIG. 4, conductive terminals of a conventional mini displayport (not shown) are respectively configured on upper and lower sides of the rear of the electric connector, and are electrically connected with a circuit board 200 using through hole connection technology (Through Hole), or called Pin in Paste (PIP) method, and Surface Mount Technology (SMT). The through holes on the circuit board are numbered in odd from #1 to #19, and are arranged in a top-down manner. The through holes, #1, #7, #13 and #19, on the circuit board are used to couple with a ground terminal; and the through holes, #3 and #5, through holes #9 and #11, and through holes #15 and #17, are used to couple with paired high-speed signal terminals, as shown in FIG. 4. Through holes #5 and #7, and through holes #13 and #15 are in different arrangement sequence from the conductive terminals of the connection, such as through hole #7 in front of through holes #5, #15 in front of through hole #13. Therefore, the conductive terminal structure might require modification, because the conductive terminals of the connector should be fitted with the through holes on the circuit board, and crossed pin issues and of signal, skew might occur. In addition, this conductive terminal structure is complicated and hard to fabricate. Thus, there is a need to effectively reduce the signal skew, and to manufacture the conductive terminals with a simple structure, so as to effectively enable stable high-speed signal transmission.

SUMMARY

The object of the invention, among others, is to provide an electrical connector, which employs an unique arrangement structure design of terminal sets to simplify the coupling of terminals with circuit board and to enable stable high speed signal transmission and effectively reducing signal skew.

An electrical connector for connection with a circuit board having a plurality of through holes and a plurality of SMT contacts. The electrical connector having a plurality of through hole terminals positioned according to the plurality of through holes and arranged in a top-down manner along an upper row and a lower row, and a plurality of SMT terminals positioned sequentially adjacent to each other along a common row in corresponding position to the plurality of SMT contacts on the circuit board.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENT(S)

The embodiments according to the present invention are described in the following context. It should be noted that the disclosed embodiments are only used for illustration. The scope of the invention is not limited by the disclosed embodiments including specific features, structures or characteristics, but is defined by the attached claims after the specification. Moreover, the figures referred in the specification does not substantially depict all the unnecessary features of the invention, and the depicted elements might possibly be simplified and expressed in an illustrative manner. The sizes for each element in the figures may be exaggerated or not compliant to the actual scale for convenience of the description. No matter what have been briefed or whether the associated features have been described in details, it is all meant that the description should be within the knowledge scope that the skilled in the related art may implement with other embodiments in association with other equivalent features, structures and characteristics based on the description.

Figure 1A:
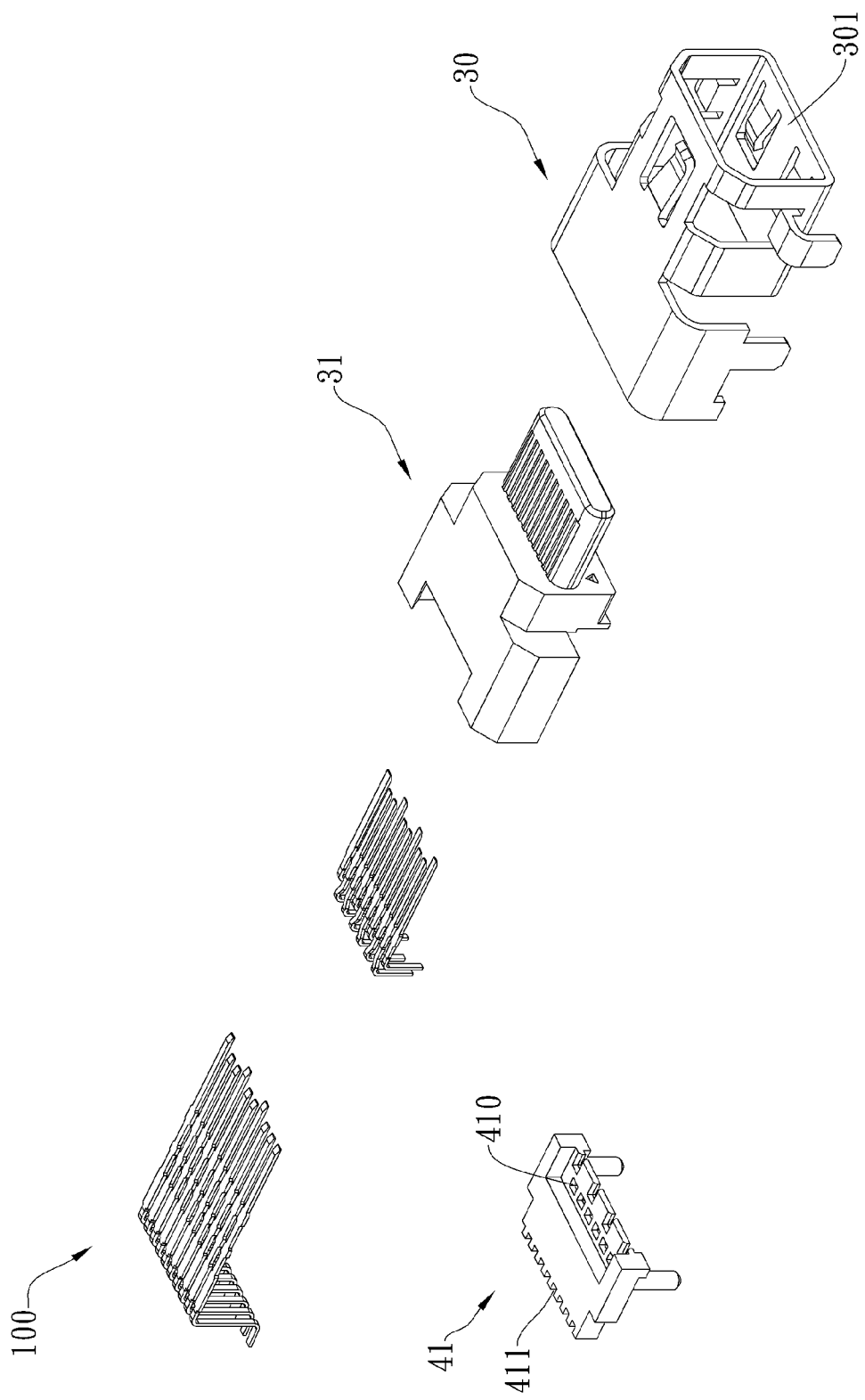
FIG. 1A is an exploded perspective view of a mini displayport connector according to the invention.
Figure 1B:
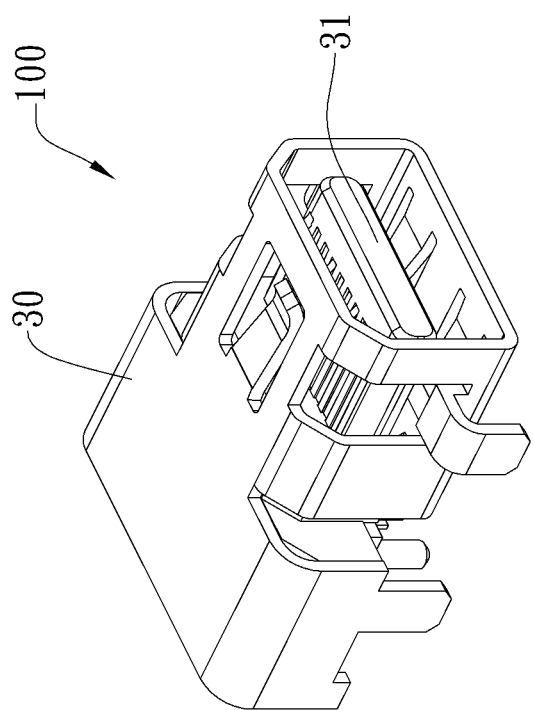
FIG. 1B is a perspective assembly view for the mini displayport connector according to the invention.

Now, with reference to FIGS. 1A and 1B., a mini displayport connector 100 is shown having a shielding shell 30, an insulation body 31, a plurality of first ground terminals 32, a plurality of first high speed signal terminal sets 33, a hot plug detect terminal 34, a low speed signal terminal set 35, a second ground terminal 36, a second high speed signal terminal set 37, a third ground terminal 38, a third high speed signal terminal set 39, a power signal terminal 40 (see also FIG. 1C and FIG. 1E), and a partition plate 41. The shielding shell 30 has an insulation body receiving space 301, and the insulation body 31 is configured within the insulation body receiving space 301, and includes a plurality of terminal slots (not shown, referring to FIG. 2B). The plurality of first ground terminals 32, the plurality of first high speed signal terminal sets 33, the hot plug detect terminal 34, the low speed signal terminal set 35, the second ground terminal 36, the second high speed signal terminal set 37, the third ground terminal 38, the third high speed signal terminal set 39 and the power signal terminal 40 are correspondingly configured in the plurality of terminal slots (referring to FIG. 2B). The partition plate 41 has a plurality of passageways 410 and a plurality of slots 411, in which the plurality of passageways 410 are used to fix the terminals for the plurality of first ground terminals 32 and the plurality of first high speed signal terminal sets 33, and the plurality of slots 411 are used to receive the terminals for the hot plug detect terminal 34, the low speed signal terminal set 35, the second ground terminal 36, the second high speed signal terminal set 37, the third ground terminal 38, the third high speed signal terminal set 39 and the power signal terminal 40.

Figure 1C:
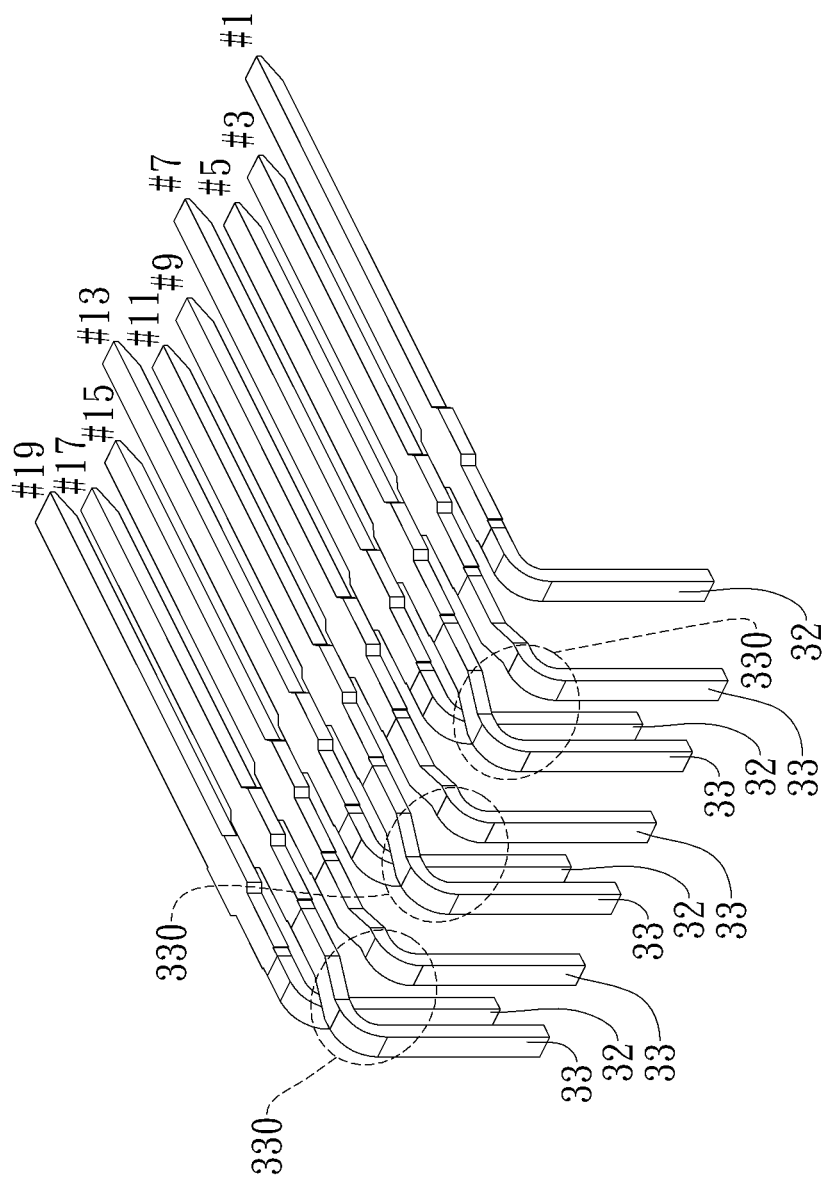
FIG. 1C is a rear perspective view of a plurality of first ground terminals and a plurality of first high speed signal terminals of the mini displayport connector according to the invention.
Figure 1D:
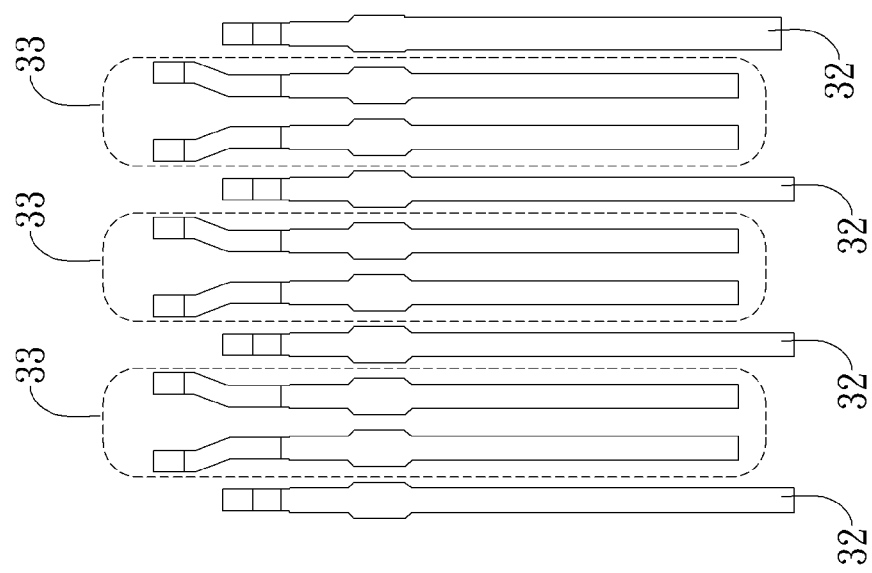
FIG. 1D is a top view for a plurality of first ground terminals and a plurality of first high speed signal terminals of the mini displayport connector according to the invention.

With reference to FIGS. 1C and 1D, each of the first high speed signal terminal sets 33 is configured between each of two the first ground terminals 32 in an interlaced configuration, and each of the first high speed signal terminal sets 33 includes a bent portion 330. The bent portion 330 is symmetrically bent outwardly and then extended downwardly, such that each of the first high speed signal terminal sets 33 and each of the first ground terminals 32 are arranged as one in the front and another in the rear. When viewed from the top (referring to FIG. 1D), each of the first high speed signal terminal sets 33 has the same length, such that the distances of signal transmission path for each of the first high speed signal terminal sets 33 are equal. By having the equal length for each of the first high speed signal terminal sets 33, the speed and distance for signal transmission are equal, so as to enable stable high speed signal transmission and effectively reduce signal skew.

In the embodiment shown, the pins represented by the plurality of first ground terminals 32 are sequentially pins 1, 7, 13 and 19, and the pins represented by the plurality of first high speed signal terminal sets 33 are sequentially pins (3, 5), pins (9, 11) and pins (15, 17).

Furthermore, in the shown embodiment, the distances between the plurality of first ground terminals 32 are all 1.8 mm, and the distances between the plurality of first high speed signal terminal sets 33 are all 0.9 mm.

Figure 1E:
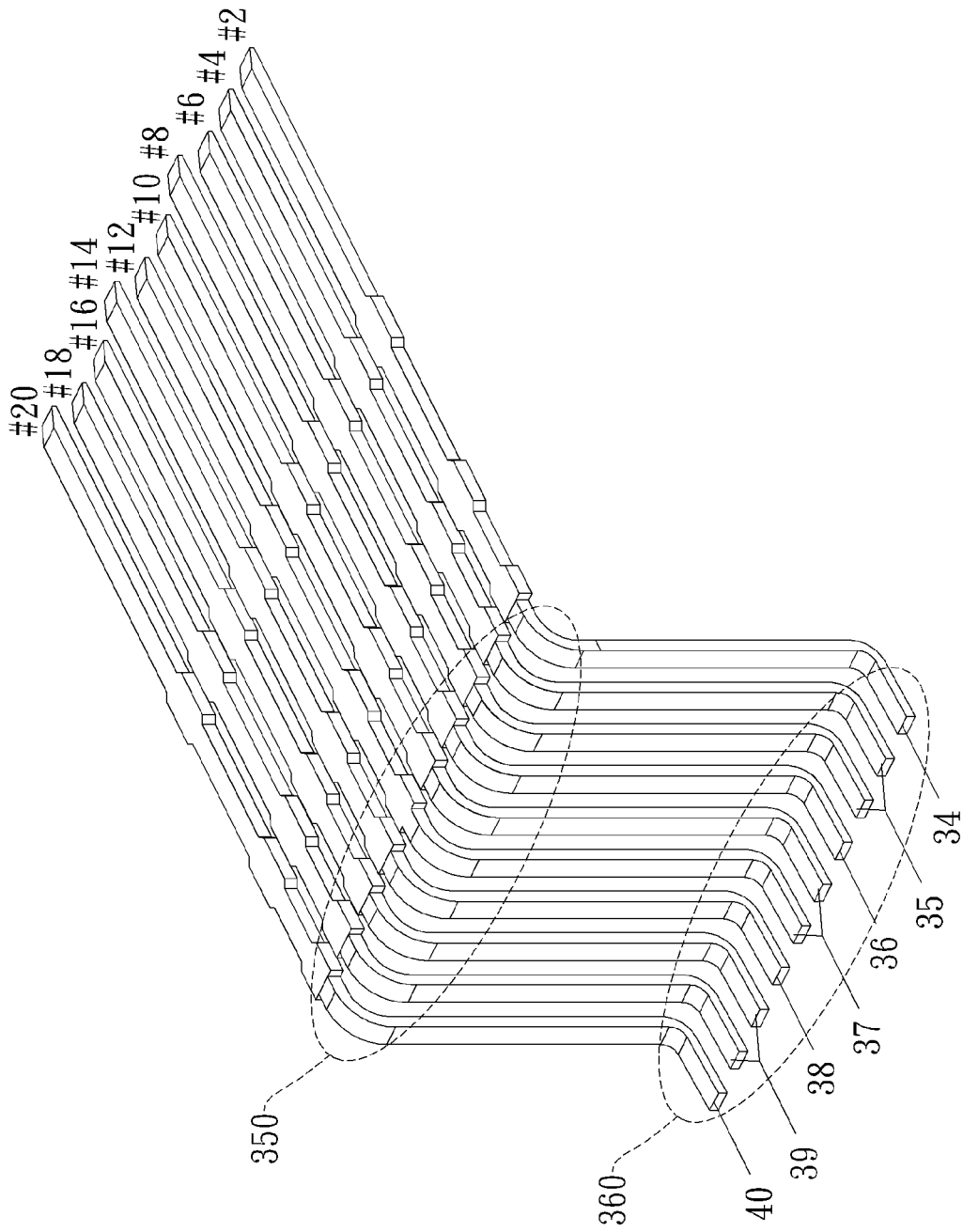
FIG. 1E is a rear perspective view for a hot plug detect terminal, low speed signal terminal set, second ground terminal and second high speed signal terminal set, third ground terminal, third high speed signal terminal set, power signal terminal of the mini displayport connector according to the invention.

Please refer to FIG. 1E, which shows a three-dimensional rear view for a hot plug detect terminal, low speed signal terminal set, second ground terminal and second high speed signal terminal set, third ground terminal, third high speed signal terminal set, power signal terminal of an embodiment according to the present invention. The hot plug detect terminal 34, the low speed signal terminal set 35, the second ground terminal 36, the second high speed signal terminal set 37, the third ground terminal 38, the third high speed signal terminal set 39 and the power signal terminal 40 are sequentially and horizontally arranged, and each of the hot plug detect terminal 34, the low speed signal terminal set 35, the second ground terminal 36, the second high speed signal terminal set 37, the third ground terminal 38, the third high speed signal terminal set 39 and the power signal terminal 40 has a bent portion 350 and a welding portion 360, in which the bent portion 350 is extended downwardly, and the welding portion 360 is extended downwardly from the bent portion 350, and then bent horizontally.

In the shown embodiment, the pin represented by the hot plug detect terminal 34 is pin 2, the low speed signal terminal set 35 is pin (4, 6), the second ground terminal 36 is pin 8, the second high speed signal terminal set 37 is pin (10, 12), the third ground terminal 38 is pin 14, the third high speed signal terminal set 39 is pin (16, 18), and the power signal terminal 40 is pin 20.

Figure 1F:
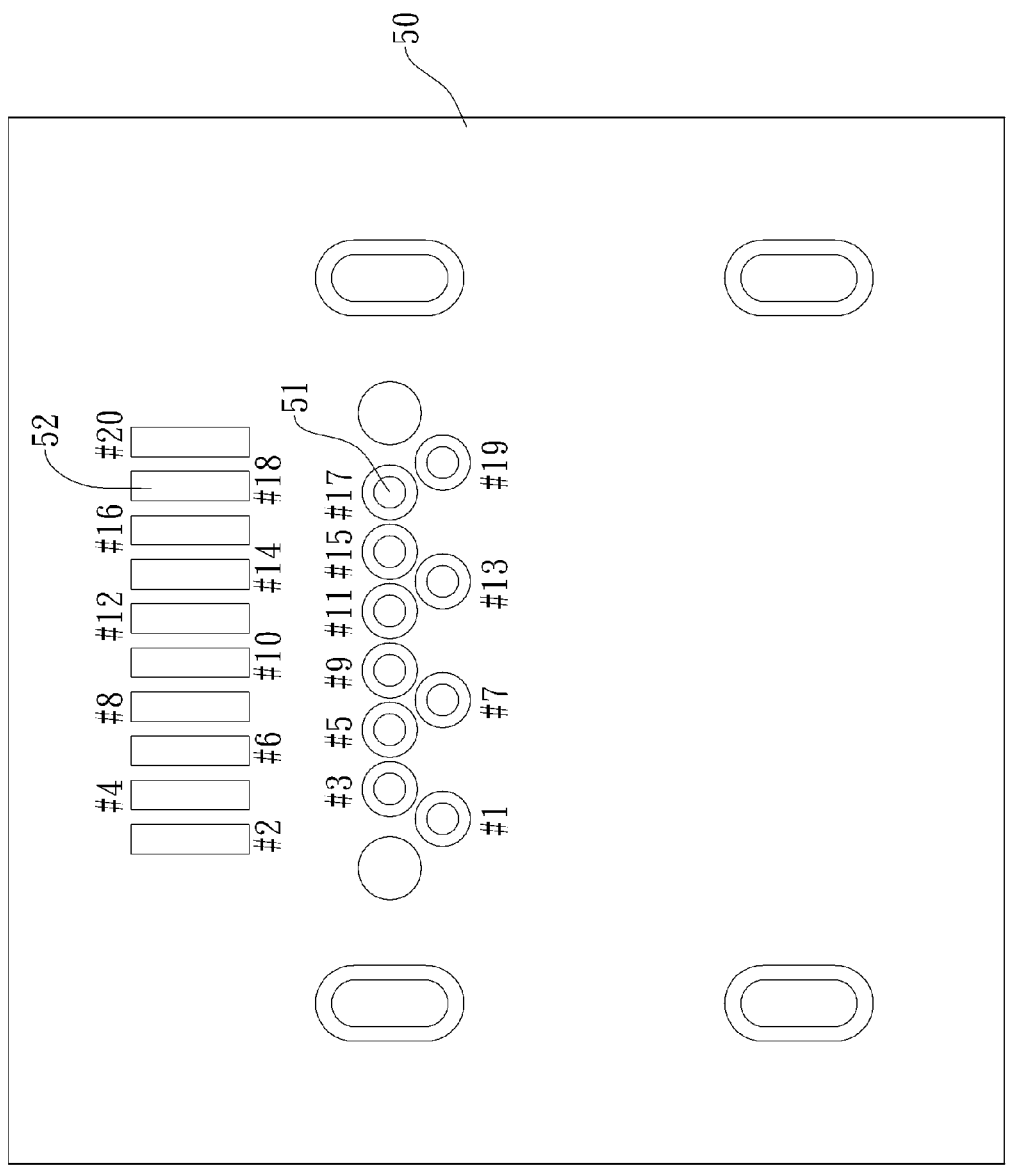
FIG. 1F illustrates a diagram of a circuit board that is fitted and coupled to the mini displayport connector according to the invention.
Figure 1G:
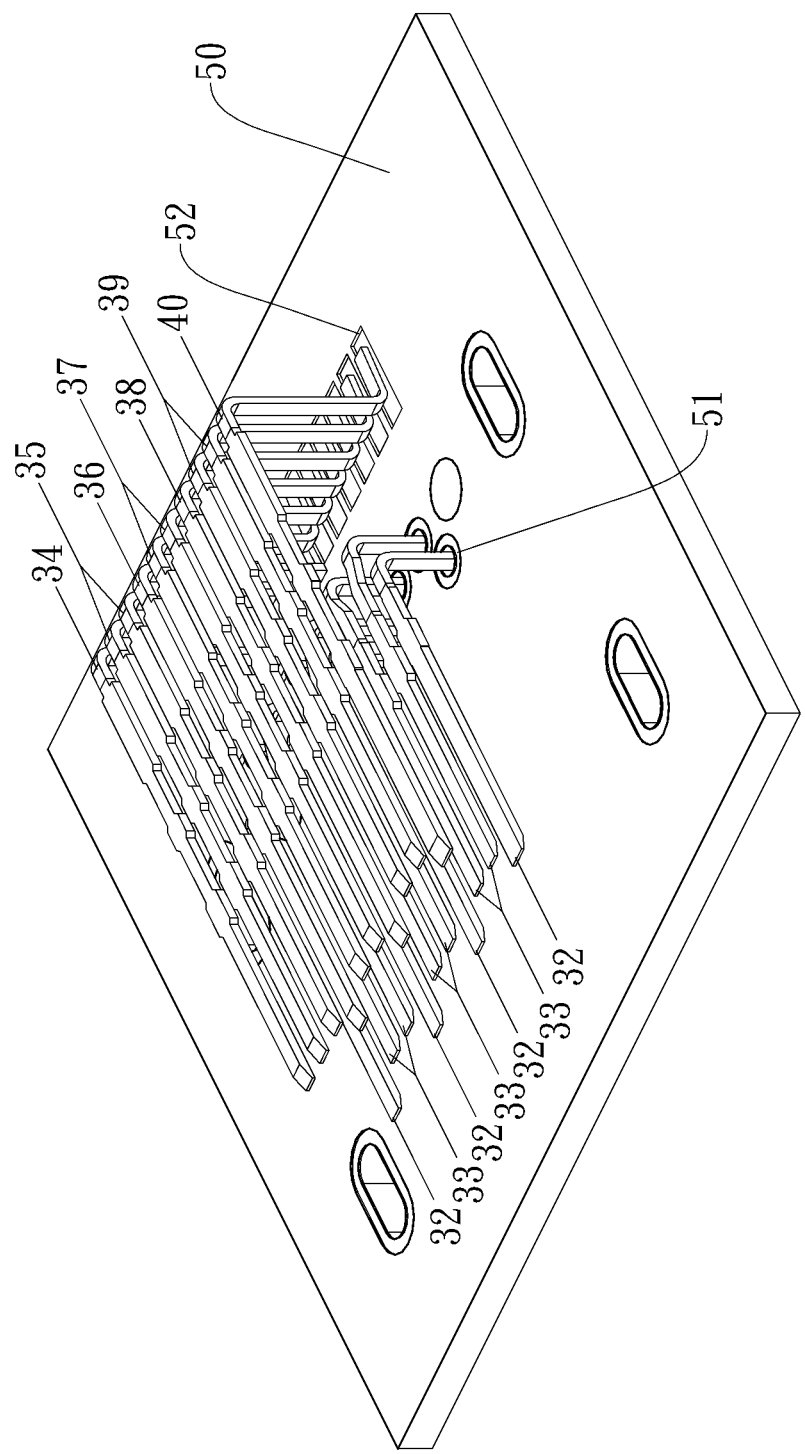
FIG. 1G is a perspective view of the mini displayport connector according to the invention coupled to a circuit board.

With reference to FIG. 1F, a diagram of a circuit board 50 is shown, which is fitted and coupled with the mini displayport connector 100 (see FIG. 1G). The mini displayport connector 100 is used to be coupled onto the circuit board 50 having a plurality of through holes 51 and a plurality of SMT contacts 52. The plurality of through holes 51 are respectively in odd numbers #1 to #19 from left to right, and the plurality of through holes 51 are arranged in a top-down manner. Each two through holes of the lower row and each two through holes of the upper row are arranged in an interlaced manner, that is, the through holes #3, #5 of the upper row are configured between the through holes #1, #7 of the lower row; the through holes #9, #11 of the upper row are configured between the through holes #7, #13 of the lower row; and, the through holes #15, #17 of the upper row are configured between the through holes #13, #19 of the lower row in an interlaced arrangement. The plurality of SMT contacts 52 are respectively in even numbers #2 to #20 from left to right, and the plurality of SMT contacts 52 are arranged in parallel.

With reference to FIG. 1G, the plurality of first ground terminals 32 are coupled with the through holes of the lower row of the circuit board 50 sequentially in odd number based on the pin assignment with an interval. Each of the plurality of first high speed signal terminal sets 33 are coupled with the through holes of the upper row of the circuit board 50 in pairs and sequentially in odd number based on the pin assignment with an interval, that is, the plurality of first ground terminals 32 are sequentially coupled with the through holes #1, #7, #13 and #19 of the circuit board 50, and each of the first high speed signal terminal sets 33 is sequentially coupled with the through holes #3, #5, #9, #11, #15 and #17 of the circuit board 50, such that the plurality of first ground terminals 32 and each of the first high speed signal terminal sets 33 are arranged based on the numbering sequence for the through holes 51 of the circuit board 50. The bent portion 330 of each of the plurality of first high speed signal terminal sets 33 is symmetrically bent outwardly, and then extended downwardly, such that the distances of signal transmission path from each of the first high speed signal terminal sets 33 to the circuit board 50 are equal. Thus, it is not easy to have the signal interference problem, and the welding portions 360 of the hot plug detect terminal 34, the low speed signal terminal set 35, the second ground terminal 36, the second high speed signal terminal set 37, the third ground terminal 38, the third high speed signal terminal set 39 and the power signal terminal 40 are correspondingly and sequentially in even numbers coupled with the plurality of SMT contacts 52 (even numbers #2 to #20) of the circuit board 50 based on the pin assignment.

Figure 2A:
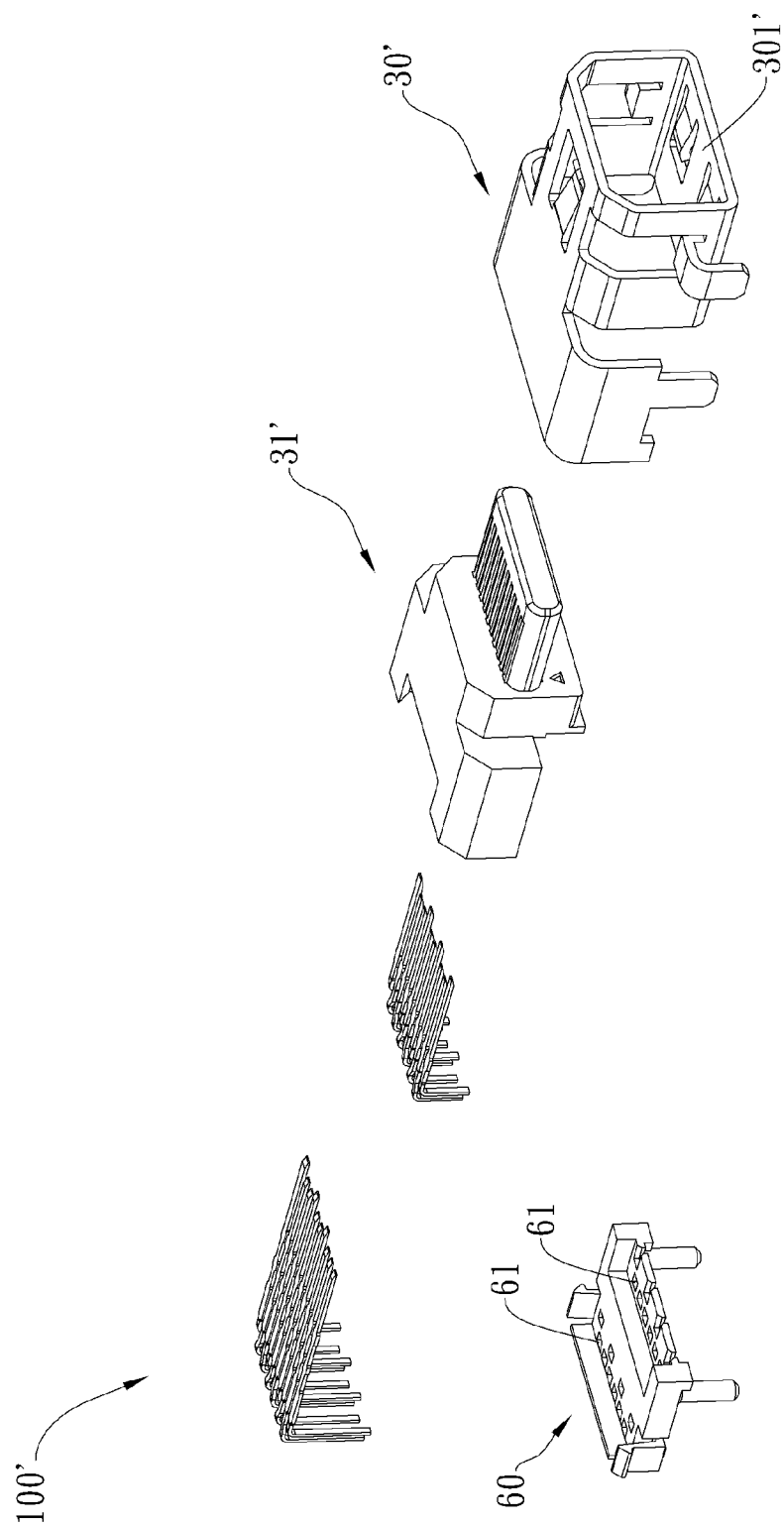
FIG. 2A is an exploded perspective front view for another mini displayport connector of according to the invention.
Figure 2B:
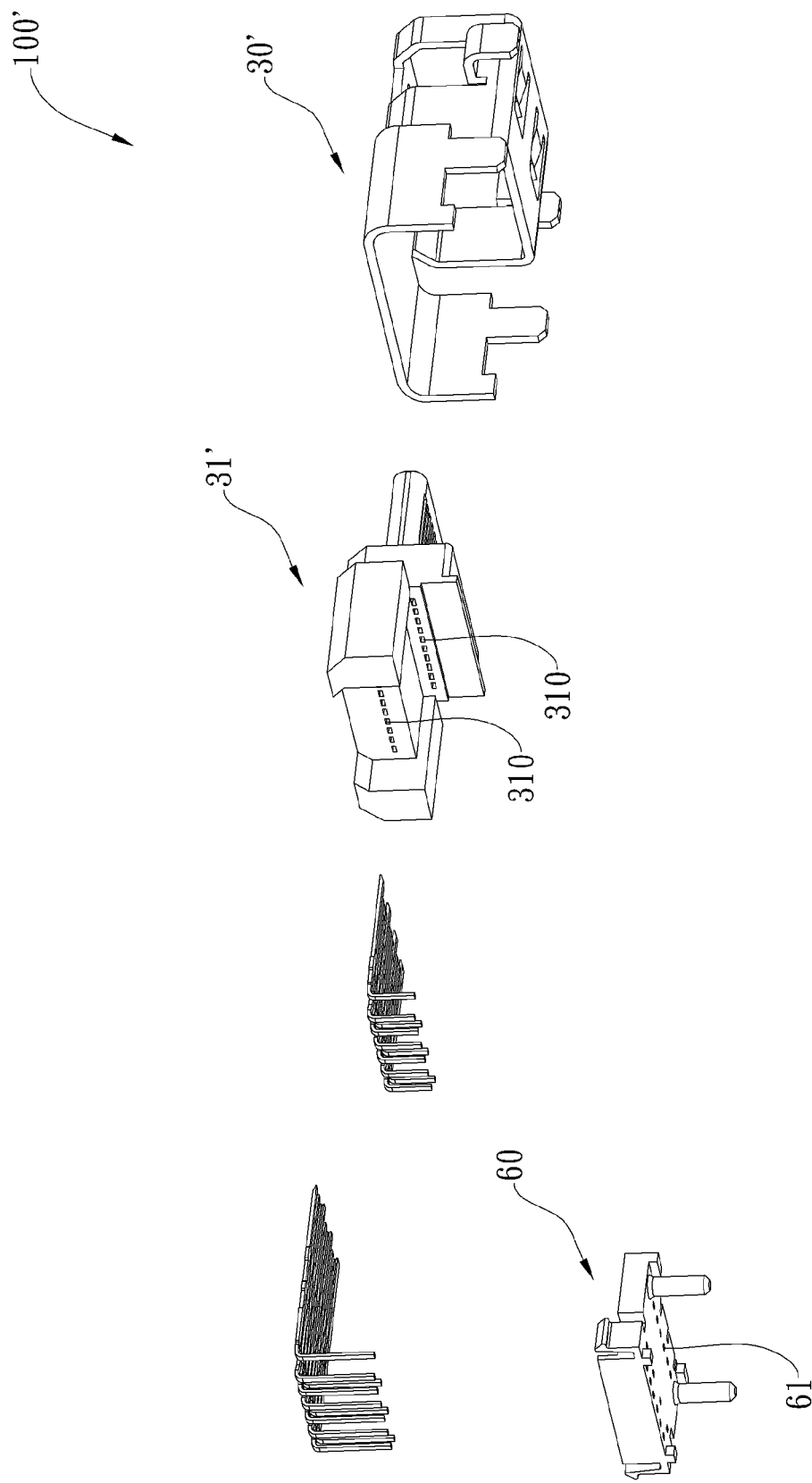
FIG. 2B is an exploded perspective rear view of the mini displayport connector shown in FIG. 2A.

Now with reference to FIG. 2A and FIG. 2B, another mini displayport connector 100' according to the invention is shown, and includes a shielding shell 30', an insulation body 31', a plurality of first ground terminals 32', a plurality of first high speed signal terminal sets 33', a hot plug detect terminal 42, a low speed signal terminal set 43, a second ground terminal 44, a second high speed signal terminal set 45, a third ground terminal 46, a third high speed signal terminal set 47, a power signal terminal 48, and a partition plate 60. The shielding shell 30' includes an insulation body receiving space 301'. The insulation body 31' is configured within the insulation body receiving space 301', and includes a plurality of terminal slots 310. The plurality of first ground terminals 32', the plurality of first high speed signal terminal sets 33', the hot plug detect terminal 42, the low speed signal terminal set 43, the second ground terminal 44, the second high speed signal terminal set 45, the third ground terminal 46, the third high speed signal terminal set 47, and the power signal terminal 48 are correspondingly configured in the plurality of terminal slots 310. The partition plate 60 includes a plurality of passageways 61 for fixing the terminals for the plurality of first ground terminals 32', the plurality of first high speed signal terminal sets 33', the hot plug detect terminal 42, the low speed signal terminal set 43, the second ground terminal 44, a second high speed signal terminal set 45, the third ground terminal 46, the third high speed signal terminal set 47 and the power signal terminal 48.

Figure 2C:
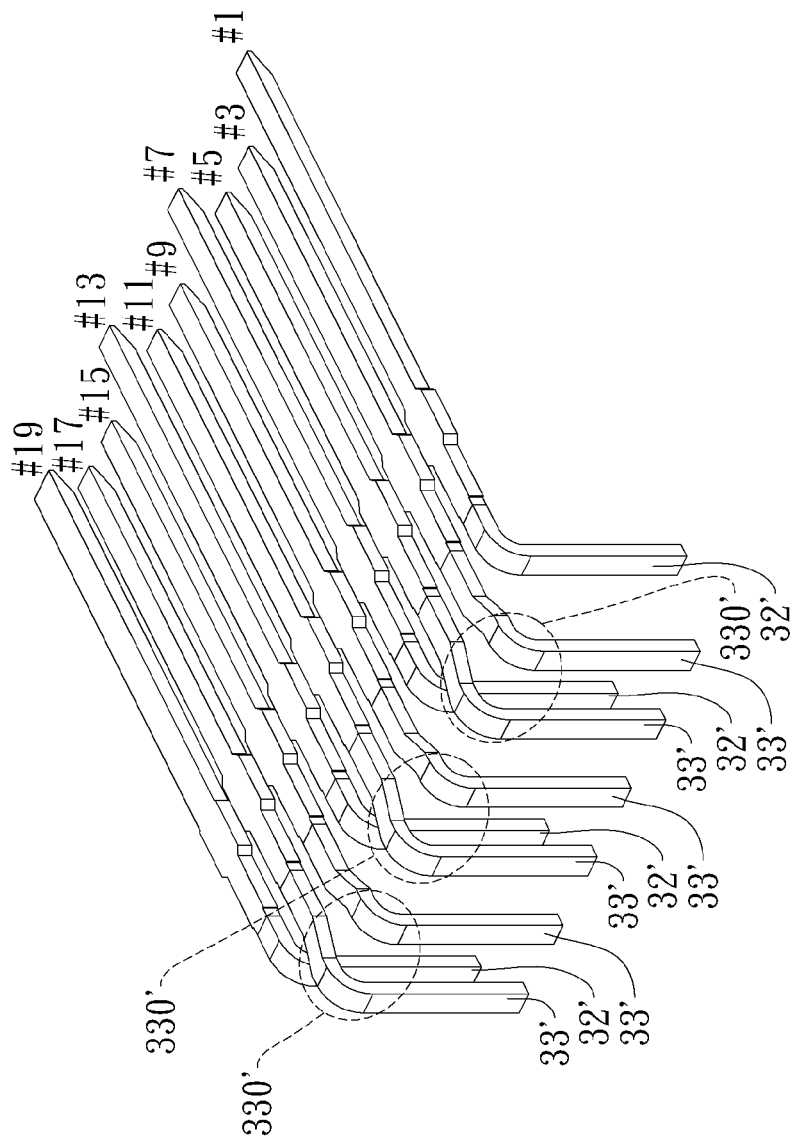
FIG. 2C is a perspective rear view for a plurality of first ground terminals and a plurality of first high speed signal terminal set of the mini displayport connector shown in FIG. 2A
Figure 2D:
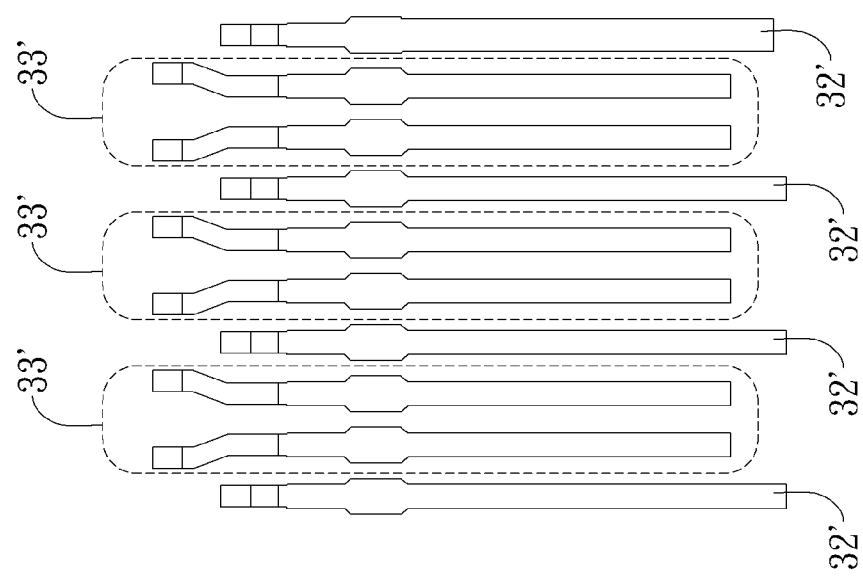
FIG. 2D is a top view for a plurality of first ground terminals and a plurality of first high speed signal terminal set of the mini displayport connector shown in FIG. 2A.

Now with reference to FIG. 2C and FIG. 2D, each of the first high speed signal terminal sets 33' is configured between two of the first ground terminals 32' in an interlaced arrangement, and each of the first high speed signal terminal sets 33' includes a bent portion 330'. The bent portion 330' is symmetrically bent outwardly and then extended downwardly, such that each of the first high speed signal terminal sets 33' and each of the first ground terminals 32' are arranged as one in the front and another in the rear. When viewed from the top view (referring to FIG. 2D), each of the first high speed signal terminal sets 33' has the same length, such that the distances for signal transmission path of each of first high speed signal terminal sets 33' are equal. By having the equal length for each of the first high speed signal terminal sets 33', the speed and distance of signal transmission are equal, so as to enable stable high speed signal transmission and effectively reduce signal skew.

In the shown embodiment, the plurality of first ground terminals 32' are sequentially pins 1, 7, 13 and 19, and the pins represented by the plurality of first high speed signal terminal sets 33' are sequentially pins (3, 5), pins (9, 11), and pins (15, 17).

Figure 2E:
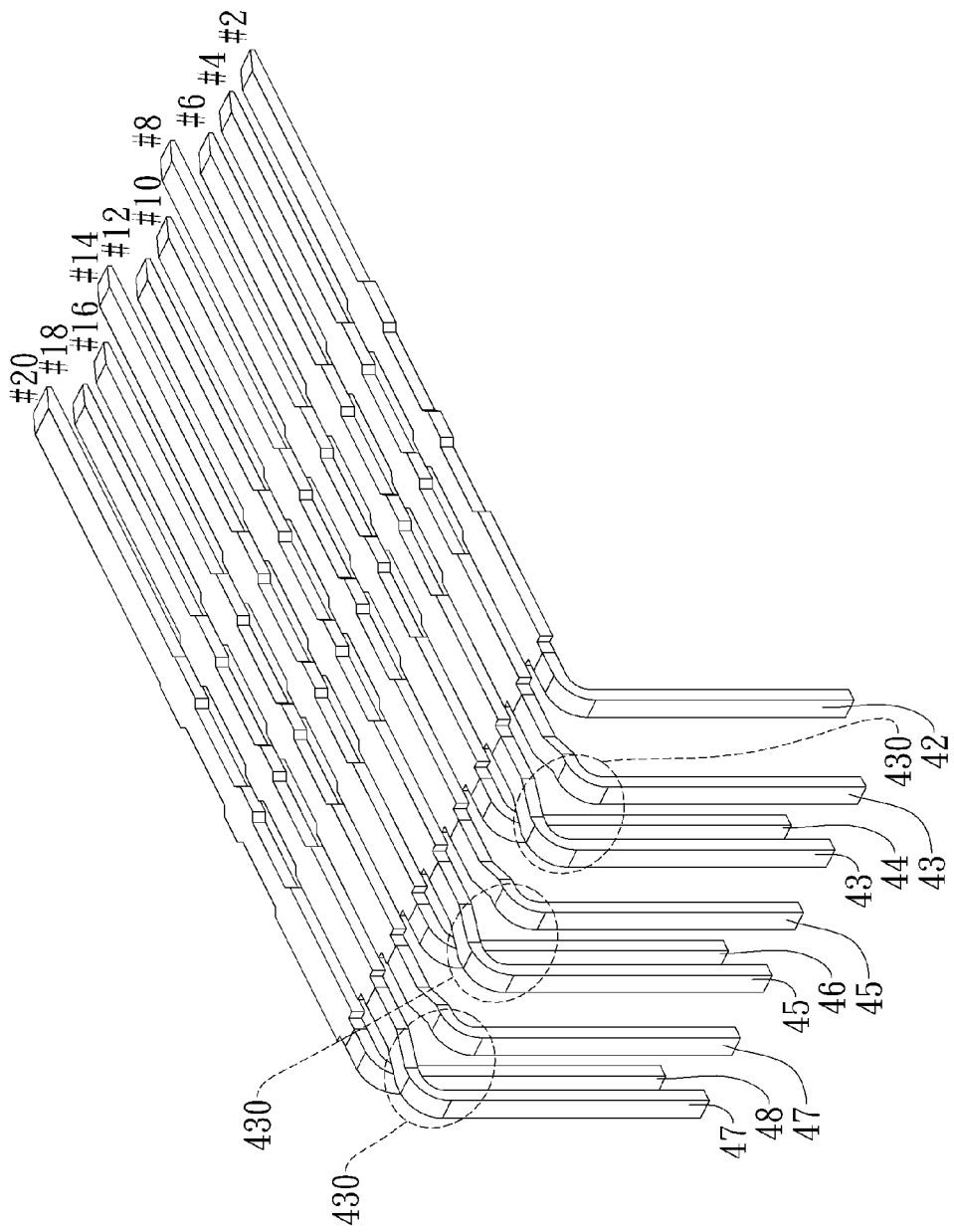
FIG. 2E is a three-dimensional rear view for a hot plug detect terminal, low speed signal terminal set, second ground terminal, second high speed signal terminal set, third ground terminal, third high speed signal terminal set, power signal terminal of the mini displayport connector shown in FIG. 2A.
Figure 2F:
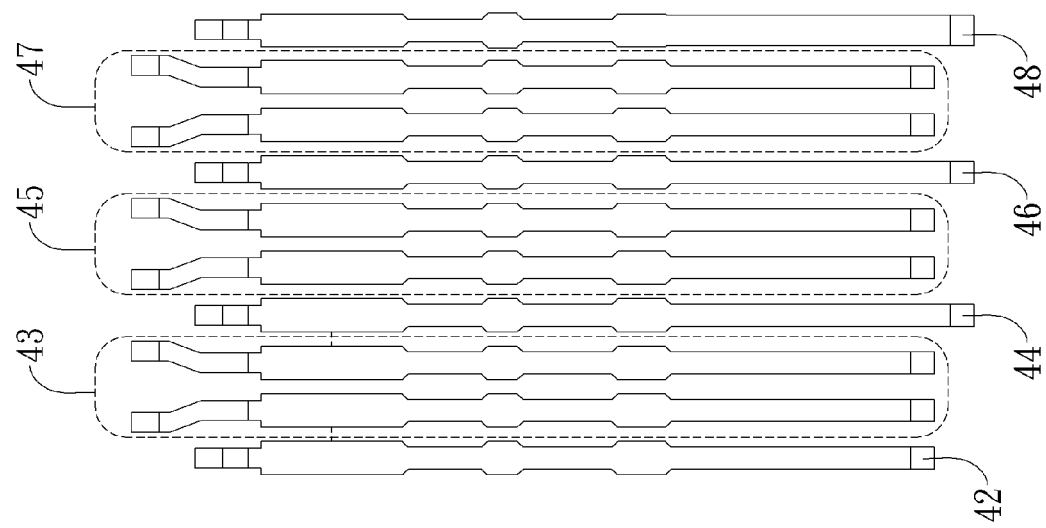
FIG. 2F is a top view for a hot plug detect terminal, low speed signal terminal set, second ground terminal, second high speed signal terminal set, third ground terminal, third high speed signal terminal set, power signal terminal of the mini displayport connector shown in FIG. 2A.

With reference to FIG. 2E and FIG. 2F, the low speed signal terminal set 43 is configured between the hot plug detect terminal 42 and the second ground terminal 44, the second high speed signal terminal set 45 is configured between the second ground terminal 44 and the third ground terminal 46, and the third high speed signal terminal set 47 is configured between the third ground terminal 46 and the power signal terminal 48, such that the hot plug detect terminal 42, the second ground terminal 44, the third ground terminal 46 and the power signal terminal 48 are sequentially in an interlaced configuration with the low speed signal terminal set 43, the second high speed signal terminal set 45 and the third high speed signal terminal set 47, and each of the low speed signal terminal sets 43, the second high speed signal terminal set 45 and the third high speed signal terminal set 47 includes a bent portion 430, and each bent portion 430 is symmetrically bent outwardly and then extended downwardly, such that the low speed signal terminal set 43, the second high speed signal terminal set 45, the third high speed signal terminal set 47 and the hot plug detect terminal 42, the second ground terminal 44, the third ground terminal 46 and the power signal terminal 48 are arranged as one in the front and another in the rear. When viewed from the top (referring to FIG. 2F), the low speed signal terminal set 43, the second high speed signal terminal set 45 and the third high speed signal terminal set 47 have the same lengths, such that the distances for signal transmission path of the low speed signal terminal set 43, the second high speed signal terminal set 45 and the third high speed signal terminal set 47 are equal. By having the same lengths for the low speed signal terminal set 43, the second high speed signal terminal set 45 and the third high speed signal terminal set 47 to have the same speed and distance for signal transmission, the present invention may enable stable high speed signal transmission and effectively reduce signal skew.

In the shown embodiment, the pin represented by the hot plug detect terminal 42 is pin 2, the low speed signal terminal set 43 is pin (4, 6), the second ground terminal 44 is pin 8, the second high speed signal terminal set 45 is pin (10, 12), the third ground terminal 46 is pin 14, the third high speed signal terminal set 47 is pin (16, 18), and the power signal terminal 48 is pin 20.

Furthermore, in the shown exemplary embodiment, the distances between the plurality of first ground terminals 32' are all 1.8 mm, and the distances between the plurality of first high speed signal terminal sets 33' are all 0.9 mm. Similarly, the distances between the hot plug detect terminal 42, the second ground terminal 44, the third ground terminal 46 and the power signal terminal 48 are all 1.8 mm, and the distances between the low speed signal terminal set 43, the second high speed signal terminal set 45 and the third high speed signal terminal set 47 are all 0.9 mm.

Figure 3A:
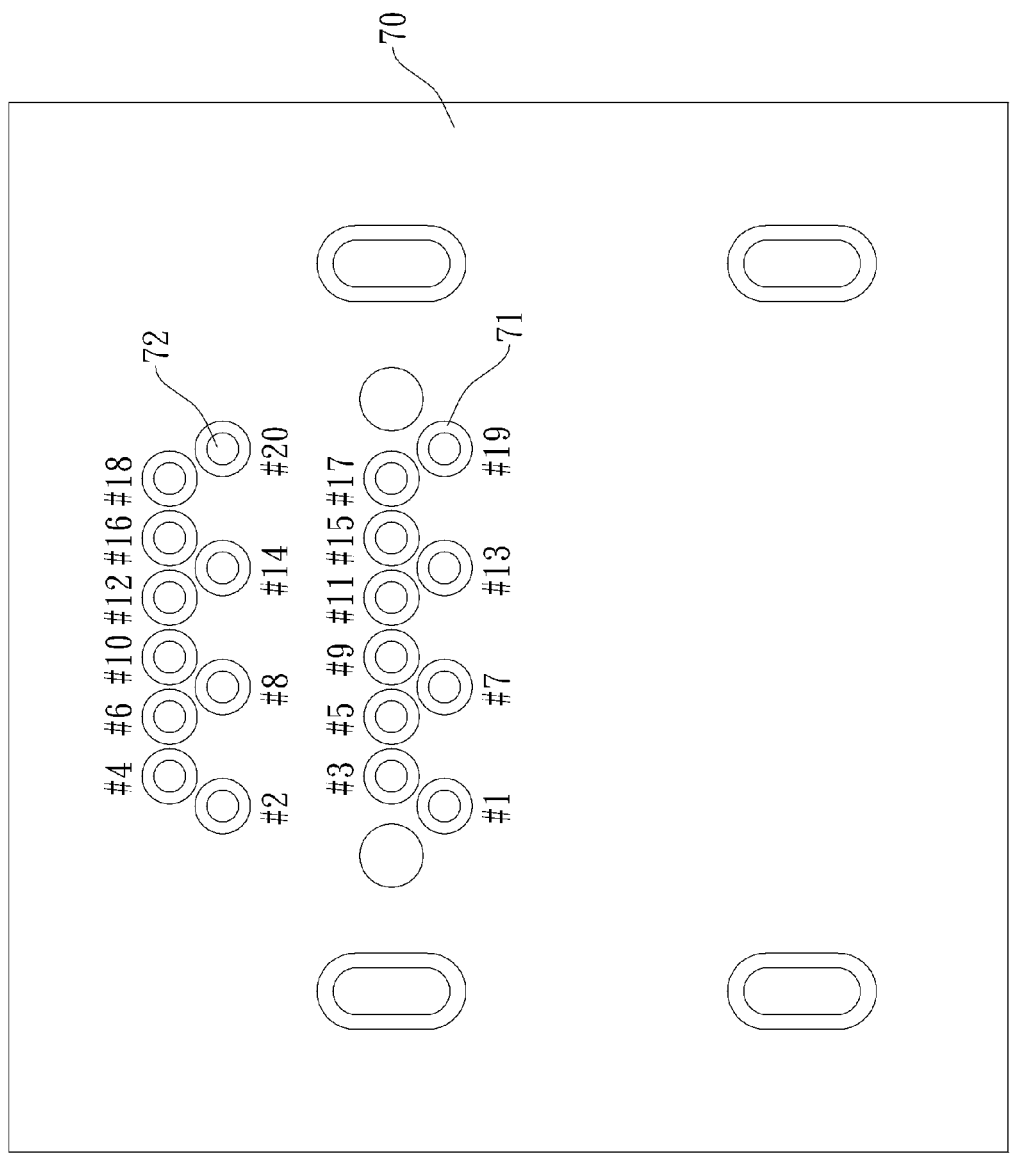
FIG. 3A illustrates a diagram of a circuit board fitted and coupled with the mini displayport connector the mini displayport connector shown in FIG. 2A.

Now, with reference to FIG. 3A, the mini displayport connector 100' is used to be coupled onto a circuit board 70. The circuit board 70 is configured with a plurality of first through holes 71 and a plurality of second through holes 72. In the shown embodiment, the plurality of first through holes 71 and the plurality of second through holes 72 are formed as four rows of through holes in a top-down manner. The plurality of first through holes 71 are numbered in odd from #1 to #19 from left to right, and the plurality of first through holes 71 are arranged in a top-down manner. Each two through holes of the lower row and each two through holes of the upper row are arranged in an interlaced manner, that is, the through holes #3, #5 of the upper row are configured between the through holes #1, #7 of the lower row, the through holes #9, #11 of the upper row are configured between the through holes #7, #13 of the lower row, and the through holes #15, #17 of the upper row are configured between the through holes #13, #19, of the lower row and arranged in an interlaced manner. The plurality of second through holes 72 are numbered in even from #2 to #20 from left to right. The plurality of second through holes 72 are also arranged in a top-down manner. Each two through holes of the lower row and each two through holes of the upper row are arranged in an interlaced manner, that is, the through holes #4, #6 of the upper row are configured between the through holes #2, #8 of the lower row, and the through holes #10, #12 of the upper row are configured between the through holes #8, #14 of the lower row, and the through holes #16, #18 of the upper row are configured between the through holes #14, #20 of the lower row, and arranged in an interlaced manner.

Figure 3B:
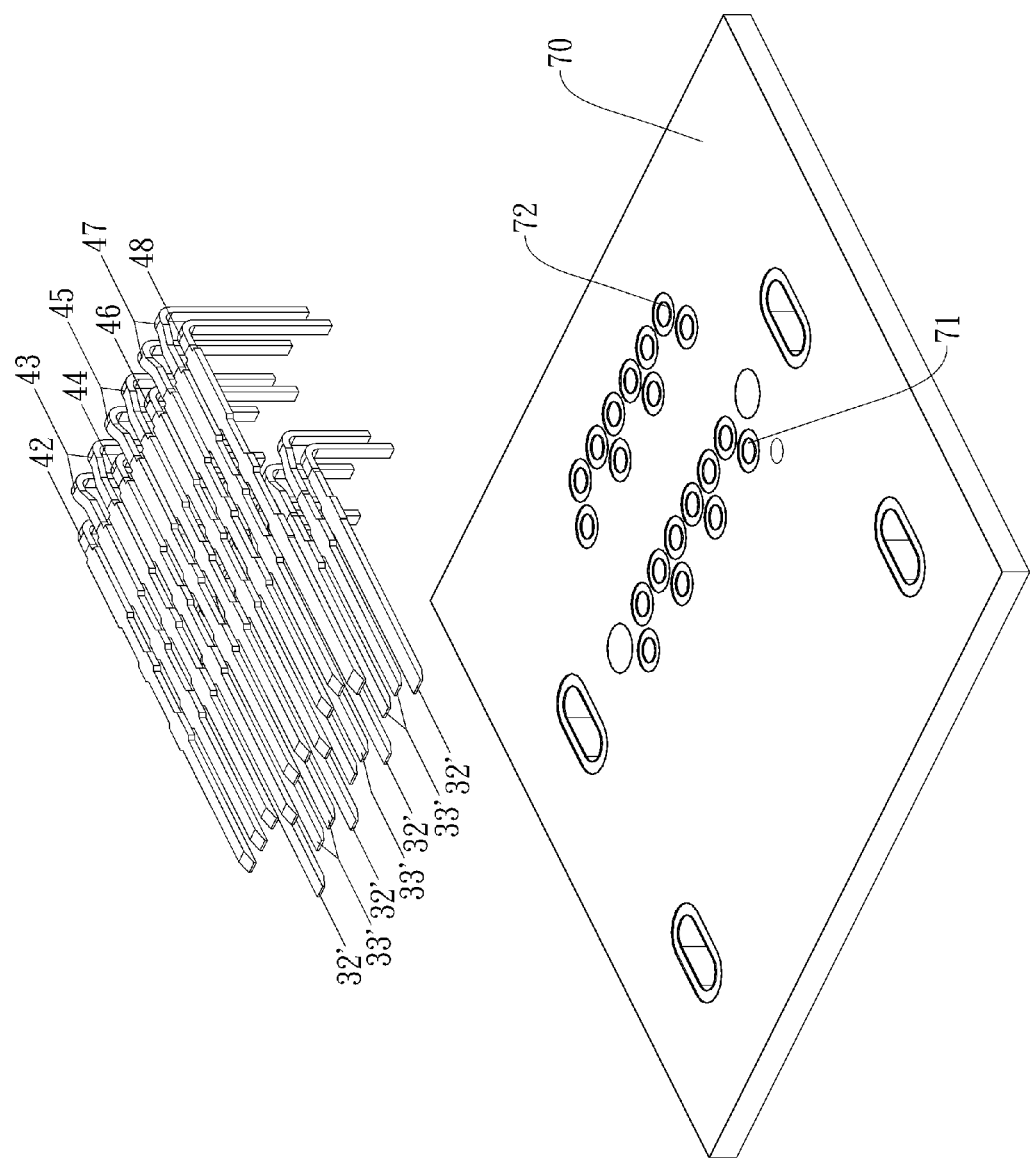
FIG. 3B is an exploded perspective view of the mini displayport connector shown in FIG. 2A coupled with the circuit board shown in FIG. 3A.
Figure 3C:
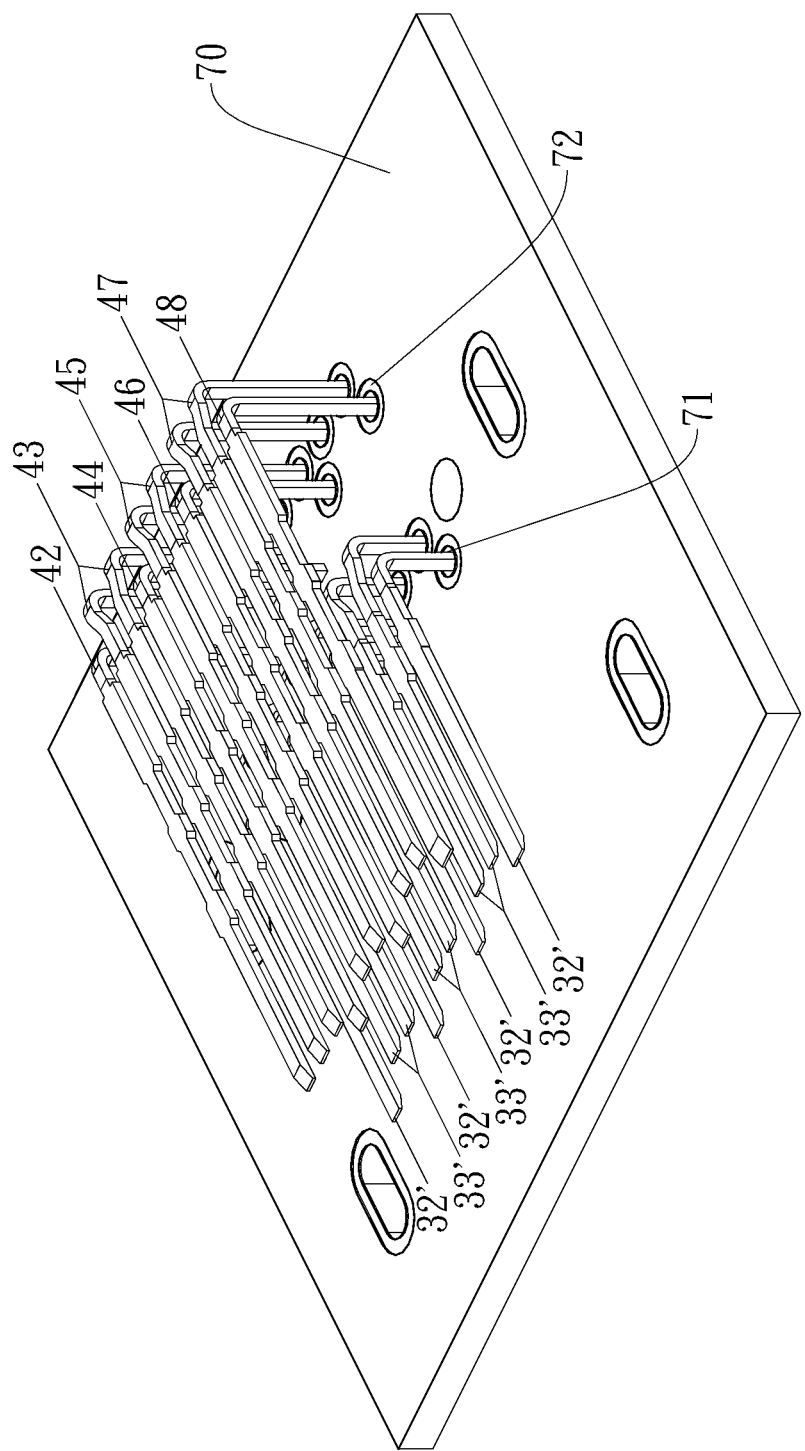
FIG. 3C is a perspective assembly view of the mini displayport connector coupled with a circuit board according to the invention.
Figure 4:
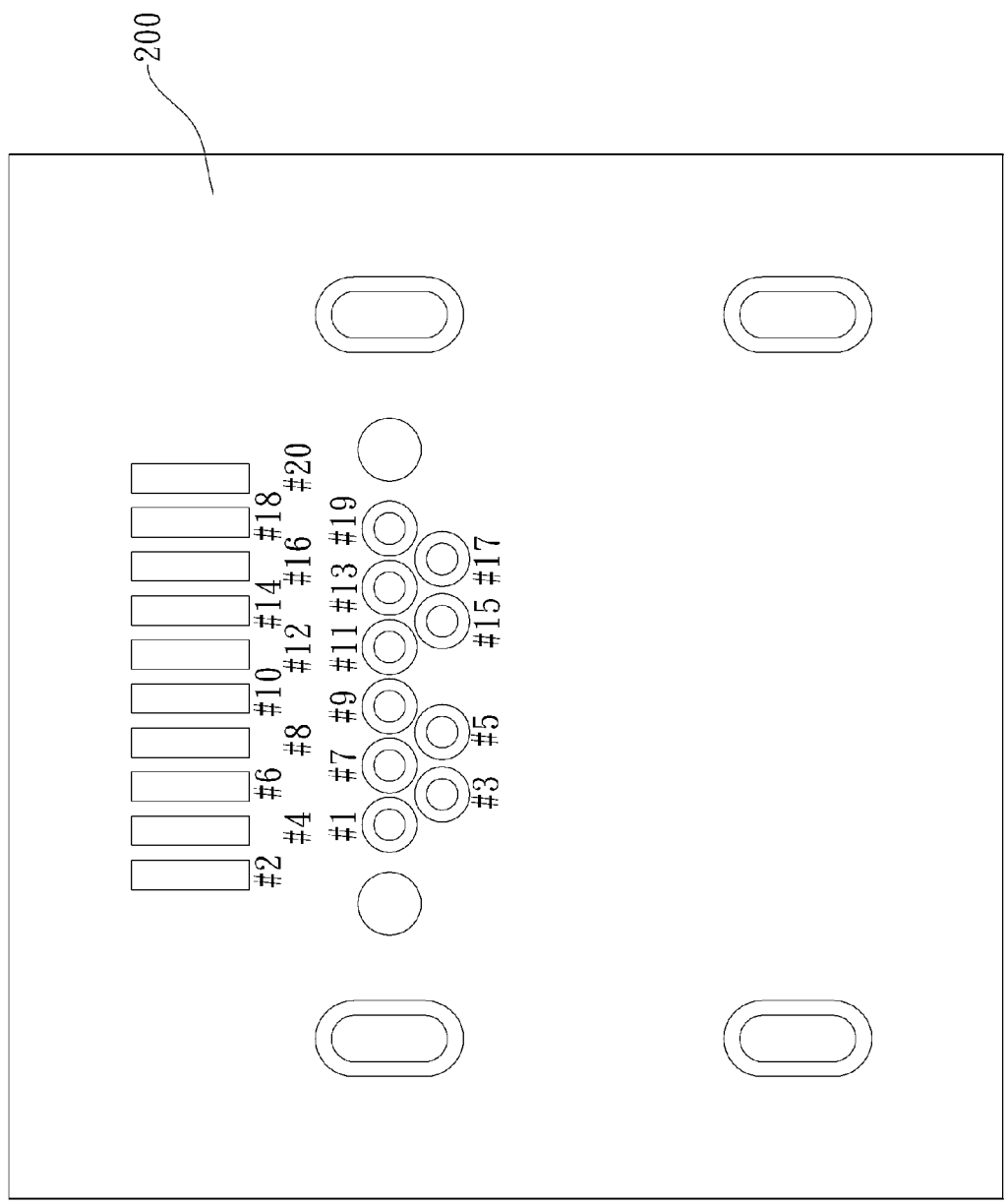
FIG. 4 is a diagram of a known circuit board that is fitted and coupled with a conventional mini displayport connector.

With reference to FIG. 3B and FIG. 3C, the plurality of first ground terminals 32' are coupled with the first through holes 71 of the lower row of the circuit board 70 sequentially in odd number based on the pin assignment with an interval. Each of the first high speed signal terminal sets 33' are coupled with the first through holes 71 of the upper row in pairs and sequentially in odd number based on the pin assignment with an interval, that is, each of the first ground terminals 32' are sequentially coupled with the through holes #1, #7, #13 and #19 of the circuit board 70, and each of the first high speed signal terminals are sequentially coupled with the through holes #3, #5, #9, #11, #15 and #17 of the circuit board 60, such that each of the first ground terminals 32' and each of the first high speed signal terminal sets 33' are sequentially arranged according to the numbering of the first through hole 71 of the circuit board 70, and the bent portion 330' of each of the first high speed signal terminal sets 33' is symmetrically bent outwardly and extended downwardly, such that the distances for signal transmission path from each of the first high speed signal terminal sets 33' to the circuit board 70 are equal, and thus it is not easy to have the signal interference problem.

The hot plug detect terminal 42, the second ground terminal 44, the third ground terminal 46 and the power signal terminal 48 are sequentially coupled in even numbers based on the pin assignment with an interval with the second through holes 72 of the lower row of the circuit board 70. The low speed signal terminal set 43, the second high speed signal terminal set 45 and the third high speed signal terminal set 47 are in pairs and sequentially coupled in even numbers based on the pin assignment with an interval with the second through holes 72 of the upper row of the circuit board 70, that is, the hot plug detect terminal 42, the second ground terminal 44, the third ground terminal 46 and the power signal terminal 48 are sequentially coupled with the through holes #2, #8, #14 and #20 of the circuit board 70, and the low speed signal terminal set 43, the second high speed signal terminal set 45 and the third high speed signal terminal set 47 are sequentially coupled with the through holes #4, #6, #10, #12, #16 and #18 of the circuit board 70, such that the hot plug detect terminal 42, the second ground terminal 44, the third ground terminal 46, the power signal terminal 48 and the low speed signal terminal set 43, the second high speed signal terminal set 45 and the third high speed signal terminal set 47 are sequentially arranged according to the numbering of the second through holes 72 of the circuit board 70, and the bent portions 430 of the low speed signal terminal set 43, the second high speed signal terminal set 45 and the third high speed signal terminal set 47 are symmetrically bent outwardly, and then extended downwardly, such that the distances for signal transmission path from the low speed signal terminal set 43, the second high speed signal terminal set 45 and the third high speed signal terminal set 47 to the circuit board 70 are equal, and thus it is not easy to have the signal interference problem. The bent portions 330' of the plurality of first high speed signal terminal sets 33' are symmetrically bent outwardly and then extended downwardly, and arranged with the plurality of first ground terminals 32' in an interlaced and front-rear arrangement, so that, during fitting and coupling with the first through holes 71 on the circuit board 70, the arrangement method for each of the first ground terminals 32' and for each of the first high speed signal terminal sets 33' are arranged according to the sequence of the first through holes 71 on the circuit board 70, so as to make manufacturing easier; and, by making each of the first high speed signal terminal sets 33' as signal terminals in pairs and with equal length, the speed and distance for signal transmission are equal to effectively reduce signal skew. Similarly, when the hot plug detect terminal 42, the second ground terminal 44, the third ground terminal 46, the power signal terminal 48 and the low speed signal terminal set 43, the second high speed signal terminal set 45 and the third high speed signal terminal set 47 are fitted and coupled onto the second through holes 72 on the circuit board 70, the arrangement method for the hot plug detect terminal 42, the second ground terminal 44, the third ground terminal 46, the power signal terminal 48 and the low speed signal terminal set 43, the second high speed signal terminal set 45 and the third high speed signal terminal set 47 are arranged according to the sequence of the second through holes 72 on the circuit board 70, so as to achieve the same effect as mentioned above, which is not described again.

Exemplary embodiments according to the invention have been described in detailed. The skilled in the art may clearly understand that there are all kinds of variations and changes to be made without departing from the spirit and scope of the following claims, and the invention is also not limited to the implementations for the embodiments illustrated in the specification.

What is claimed is:
1. An electrical connector comprising:
a plurality of through hole terminals arranged in a top-down manner along an upper row and a lower row, the plurality of through hole terminals including:
a plurality of first ground terminals positioned sequentially along the lower row;

a plurality of first high speed signal terminal sets positioned along the upper row with a pair of each of the plurality of first high speed signal terminal sets located between each plurality of first ground terminals in an interlaced arrangement; and a plurality of SMT terminals positioned sequentially adjacent to each other along a common row, the plurality of SMT terminals including:
a hot plug detect terminal;
a low speed signal terminal set;
a second ground terminal;
a second high speed signal terminal set;
a third ground terminal;
a third high speed signal terminal set; and
a power signal terminal.

2. The electrical connector according to claim 1, wherein each of the plurality of first high speed signal terminal sets has a bent portion symmetrically bent outward and downward such that lengths of signal transmission paths through each of the first high speed signal terminal sets are equal.

3. The electrical connector according to claim 1, further comprising a shielding shell having an insulation body receiving space.

4. The electrical connector according to claim 3, further comprising an insulation body configured to fit within the insulation body receiving space and including a plurality of terminal slots.

5. The electrical connector according to claim 4, wherein the plurality of first ground terminals, the plurality of first high speed signal terminal sets, the hot plug detect terminal, the low speed signal terminal set, the second ground terminal, the second high speed signal terminal set, the third ground terminal, the third high speed signal terminal set and the power signal terminal are received within the plurality of terminal slots.

6. The electrical connector according to claim 1, further comprising a partition plate having a plurality of passageways and a plurality of slots.

7. The electrical connector according to claim 6, wherein the plurality of first ground terminals and the plurality of first high speed signal terminal sets are received by the plurality of passageways.

8. The electrical connector according to claim 7, wherein the hot plug detect terminal, the low speed signal terminal set, the second ground terminal, the second high speed signal terminal set, the third ground terminal, the third high speed signal terminal set and the power signal terminal are received by the plurality of slots.

9. The electrical connector according to claim 1, wherein distances between the plurality of first ground terminals are 1.8 mm, and distances between the plurality of first high speed signal terminals sets are 0.9 mm.

10. An electrical connector comprising:
a plurality of first through hole terminals arranged along a first upper row and a first lower row, the plurality of first through hole terminals including:
a plurality of first ground terminals sequentially positioned along the first lower row;
a plurality of first high speed signal terminal sets positioned along the first upper row with a pair of each of the plurality of first high speed signal terminal sets configured between each plurality of first ground terminals in an interlaced arrangement, each of the plurality of first high speed signal terminal sets having a bent portion symmetrically bent outward and downward such that lengths of signal transmission paths therethrough are equal; and a plurality of second through hole terminals positioned with the plurality of second through holes and arranged along a second upper row and a second lower row, the a plurality of second through hole terminals including:
a hot plug detect terminal, a second ground terminal, a third ground terminal, and a power signal terminal positioned along the second lower row;
a low speed signal terminal set positioned along the second upper row and between the hot plug detect terminal and the second ground terminal;
a second high speed signal terminal set positioned along the second upper row adjacent to the low speed signal terminal set and between the second ground terminal and the third ground terminal; and
a third high speed signal terminal set positioned along the second upper row and between the third ground terminal and the power signal terminal, the low speed signal terminal set, the second high speed signal terminal set and the third high speed signal terminal set include a bent portion that is symmetrically bent outwardly and extends downwardly such that signal transmission path lengths through each of the first high speed signal terminal sets, the low speed signal terminal set, the second high speed signal terminal set and the third high speed signal terminal set are equal.

11. The electrical connector according to claim 10, further comprising a shielding shell having an insulation body receiving space.

12. The electrical connector according to claim 11, further comprising an insulation body configured to fit within the insulation body receiving space and includes a plurality of terminal slots.

13. The electrical connector according to claim 12, wherein the plurality of first ground terminals, the plurality of first high speed signal terminal sets, the hot plug detect terminal, the low speed signal terminal set, the second ground terminal, the second high speed signal terminal set, the third ground terminal, the third high speed signal terminal set and the power signal terminal are received within the plurality of terminal slots.

14. The electrical connector according to claim 10, further comprising a partition plate having a plurality of passageways for receiving the plurality of first ground terminals, the plurality of first high speed signal terminal sets, the hot plug detect terminal, the low speed signal terminal set, the second ground terminal, the second high speed signal terminal set, the third ground terminal, the third high speed signal terminal set, and the power signal terminal.

15. The electrical connector according to claim 10, wherein distances between the plurality of first ground terminals are 1.8 mm, and distances between the plurality of first high speed signal terminals sets are 0.9 mm.

16. The electrical connector according to claim 15, wherein the distances between the hot plug detect terminal, the second ground terminal, the third ground terminal and the power signal terminal are all 1.8 mm, and the distances between the low speed signal terminal set, the second high speed signal terminal set and the third high speed signal terminal set are all 0.9 mm.

17. An electrical connector arrangement, comprising:
a circuit board having a plurality of through holes and a plurality of SMT contacts; and
an electrical connector having:
a plurality of through hole terminals positioned according to the plurality of through holes and arranged along an upper row and a lower row, the plurality of through hole terminals including:

a plurality of first ground terminals positioned sequentially along the lower row;

a plurality of first high speed signal terminal sets positioned along the upper row with a pair of each of the plurality of first high speed signal terminal sets configured between each plurality of first ground terminals in an interlaced arrangement; and a plurality of SMT terminals positioned sequentially adjacent to each other along a common row in corresponding position to the plurality of SMT contacts on the circuit board.

18. The electrical connector arrangement according to claim 17, wherein each of the plurality of first high speed signal terminal sets include a bent portion symmetrically bent outward and downward such that of signal transmission path from each of the first high speed signal terminal sets to the circuit board are equal in length.

* * * * *